United States Patent [19]

Lyons et al.

[11] Patent Number: 4,691,091

[45] Date of Patent: Sep. 1, 1987

[54] DIRECT WRITING OF CONDUCTIVE PATTERNS

[75] Inventors: Alan M. Lyons, Summit, N.J.; Frederick T. Mendenhall, Jr., Carmel, Ind.; Murray Robbins, Berkeley Heights, N.J.; Nathaniel R. Quick, Randolph, N.J.; Cletus W. Wilkins, Jr., Westfield, N.J.

[73] Assignees: AT&T Technologies, Berkeley Heights; AT&T Bell Laboratories, Murray Hill, both of N.J.

[21] Appl. No.: 814,986

[22] Filed: Dec. 31, 1985

[51] Int. Cl.[4] .............................................. B23K 26/00
[52] U.S. Cl. ......................... 219/121 LM; 174/126 C; 219/121 L
[58] Field of Search ..... 219/121 L, 121 LM, 121 LQ, 219/121 LR, 121 LU, 121 LW, 121 LY; 174/126 C

[56] References Cited

U.S. PATENT DOCUMENTS

| | | | |
|---|---|---|---|
| 3,597,579 | 8/1971 | Lumley | 219/121 LT X |
| 3,860,784 | 1/1975 | Brown et al. | 219/121 LD |
| 4,159,414 | 6/1979 | Suh et al. | 219/121 LM |
| 4,286,250 | 8/1981 | Sacchetti | 219/121 LM X |
| 4,584,456 | 4/1986 | Oodaira et al. | 219/121 LM |

OTHER PUBLICATIONS

*Handbook of Printed Circuit Manufacturing*, Van Nostrand Reinhold Co., 1985, by R. H. Clark.

*Primary Examiner*—C. L. Albritton
*Attorney, Agent, or Firm*—Peter A. Businger

[57] ABSTRACT

Electrically conductive paths are produced on a polymeric substrate by laser writing, i.e., by tracing desired paths on the substrate by a laser beam. The resulting paths comprise electrically conductive carbon as produced by thermal decomposition of substrate surface material; the paths can serve; e.g., as electrical interconnections akin to printed circuitry on a wiring board. Optionally, the conductivity of paths can be enhanced by electroplating a suitable conductor metal or alloy onto the paths.

10 Claims, 4 Drawing Figures

DIRECT WRITING OF CONDUCTIVE PATTERNS

FIELD OF THE INVENTION

This invention relates to a method for producing conductive patterns on a polymeric substrate as may be used, e.g., in the manufacture of circuit boards.

BACKGROUND OF THE INVENTION

Conductive patterns on polymeric substrates such as, e.g., printed circuit boards typically are used to provide interconnections between devices attached to such substrates. Several methods have been used for the production of these conductive patterns; two of these, dry-film imaging and screen printing, are briefly described below.

Dry-film imaging typically involves the following steps: Electroless copper is deposited on a substrate. (The substrate may have holes for through-hole connection, in which case an acid copper flash is then applied to the substrate to add extra copper through the holes.) The copper-plated substrate is baked, a dry-film photoresist is applied to the copper coating, and the photoresist is exposed to actinic light patterned by artwork. The exposed photoresist is developed, unexposed resist is removed, and exposed copper is etched away.

Screen-printing utilizes a photomechanical stencil attached to a precision-woven fabric stretched over a frame. The stencil is attached to the fabric by soaking the fabric in a light-sensitive emulsion and exposing selected areas to actinic light; areas exposed to light become insoluble in water. The fabric is then rinsed leaving areas of open mesh. The resist is forced through the stencil onto a plated substrate, resist passing only through open mesh areas. The substrate is then exposed to an etchant which etches away those portions of the plating layer which were left uncovered by the resist.

For further details on these processes see, e.g., the book by R. H. Clark, *Handbook of Printed Circuit Manufacturing*, Van Nostrand Reinhold Co., 1985.

SUMMARY OF THE INVENTION

The invention is a method for producing conductive patterns on polymeric substrates; the patterns comprise conductive carbon resulting from the decomposition of surface material upon localized laser heating. A conductive pattern is formed by moving the laser beam or the substrate; the resulting pattern may be used, e.g., for interconnections and contacts analogous to printed circuits. Optionally, the conductive pattern is plated with a metallic conductor material.

DETAILED DESCRIPTION

Figure 1:
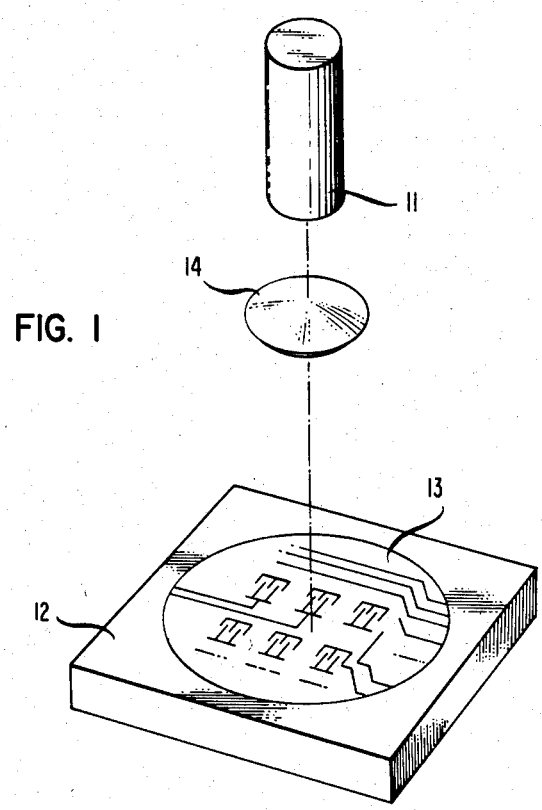
FIG. 1 shows an arrangement for practicing the invention.

Shown in FIG. 1 are laser 11, focusing lens 14, polymeric substrate 13, and x-y-programmable table or stage 12.

Figure 2:
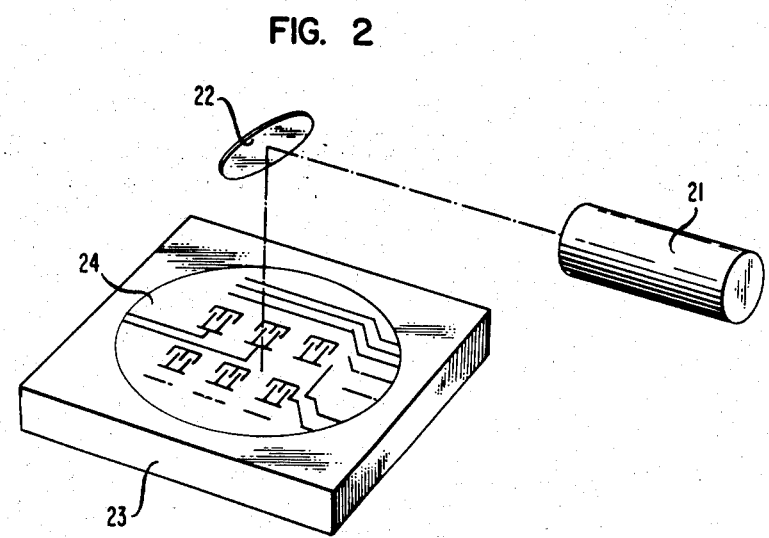
FIG. 2 shows an alternative arrangement for practicing the invention.
Figure 3:
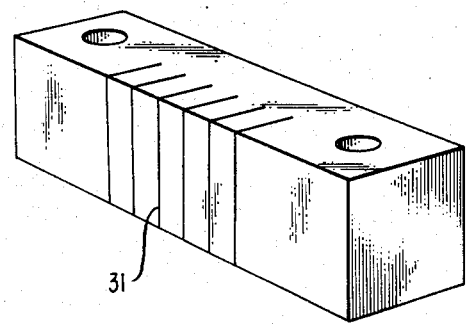
FIG. 3 shows, enlarged, an interconnection block bearing conductive paths 31 made in accordance with the invention.
Figure 4:
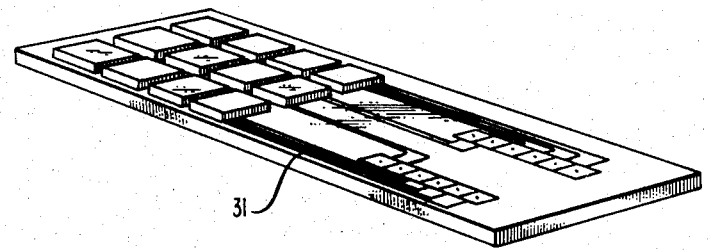
FIG. 4 shows a telephone keypad module/daughter board assembly bearing conductive paths 31 made in accordance with the invention.

Shown in FIG. 2 is laser 21, movable mirror 22, x-y-programmable table 23, and polymeric substrate 24. The mirror 22 can be moved to direct a laser beam across the substrate 24 to trace a desired pattern. Conversely, a pattern can be traced by moving table 23.

Among suitable substrate materials for processing in accordance with the invention are phenolic materials, such as, e.g., phenol formaldehyde; suitable also are polyimides, furfuryl alcohol type polymers, acrylonitriles, or any other polymer which efficiently decomposes to produce high char yields. Among specific commercial materials are Kapton (manufactured by E. I. DuPont Chemical) and Quacorr (manufactured by Quaker Oats Chemical). Preferred substrates have characteristics that permit efficient absorption of light at the laser wavelength; such characteristics can be affected by the inclusion of filler materials such as, e.g., carbon, talc, cotton, or wood flour. The resulting composite materials also tend to produce higher-density carbon chars having enhanced adhesion.

Among lasers suitable for use with the invention are Nd:YAG lasers and $CO_2$ lasers or any other continuous-wave lasers of suitable wavelength. In the interest of varying the power density of the radiation, a lens may be used to focus or defocus the beam. Defocusing is of interest to avoid excessively high power densities as result in ablation of material and in a nonconductive char. Ablation of thermally formed carbon can occur even at high writing speeds; threshold power density is approximately $10^4$ watts/cm$^2$ (15 watts total output for a beam spot size of $1.5 \times 10^{-3}$ cm$^2$) when writing with a $CO_2$ laser, and the same holds true when a Nd-YAG laser beam is used. Defocusing the beam results in lowered power density and reduced ablation. Laser operations may be $Tm_{00}$ or else multi-mode; the latter may be preferable in the interest of minimizing ablation effects.

Defocusing the beam was found to have a direct influence on the electrical resistance of a conductive path; however, such influence was found to be relatively weak. Due to such relative intensitivity of electrical resistance with respect to defocusing, conductive paths can be written directly onto nonplanar surfaces such as, e.g., telephone handset surfaces.

While the resistivity of carbon is higher than that of copper ($10^{-}$ohm-cm for carbon as compared with $10^{-6}$ ohm-cm for copper), conductive patterns made in accordance with the invention can be used in a variety of applications. For example, conductive paths are easily realized having a resistance less than 16 ohms/cm as specified for telephone keypads.

The invention can be used to produce conductive paths on molded blocks used for electrical interconnection between circuit boards; such blocks may be essentially rigid as in the case of phenolic moldings or compliant as, e.g., the case of moldings made from a suitable polyimide such as, e.g., Kapton. Similarly, the invention is applicable to module/daughter boards, conductive epoxies being convenient for attachment.

Processing in accordance with the invention represents a low-cost alternative to printed circuitry especially where specified conductive patterns comprise relatively few features, and the invention also can be used to produce resistor elements inscribed in a substrate.

EXAMPLE 1

A Nd-YAG laser (Quantronix Model 117) with an emission wavelength of 1.06 micrometers was used to irradiate a sample of phenol-formaldehyde paper laminate (copper-clad FR-2) on the unclad side. The laser was operated with a 60-mm-focal-length lens, and the focused beam had a spot size of $6.8 \times 10^{-4}$ cm$^2$. Pattern formation was achieved by moving the polymer substrate with a programmable x-y table (Anorad 1) at a speed of approximately 3 mm per second and turning the laser on and off with an electronic shutter. The experiment was performed in a nitrogen ambient by keeping the sample enclosed in a glove bag and flushing constantly with nitrogen gas. Reaction gases were continuously removed by an exhaust snorkel. Linear resistance (ohms per cm of length) was measured using a four-probe technique. The voltage drop across two inner probes spaced 1 cm apart was measured using a Keithly Model 619 electrometer-multimeter. Two outer probes, which carried a constant current supplied by a Keithly Model 220 current source, were placed approximately 1 mm outside each voltage probe. Laser power levels were determined using a Scientec 36-02 power-energy meter. At a laser power of 10 watts, conductive carbon paths with a linear resistance of approximately 6.75 ohm/cm were produced. Similarly, at laser power readings of 15 and 25 watts, conductive carbon paths with linear resistances of approximately 4.5 and 3.0 ohm/cm, respectively, were produced.

EXAMPLE 2

An experiment was carried out, analogous to Example 1, using a CO$_2$ laser (Spectra-Physics Model 42) with an emission wavelength of 10.6 micrometers to irradiate a sample of copper-clad FR-2 on the unclad size through a lens with a focal length of 12 cm. The laser beam had a spot size of $1.51 \times 10^{-3}$ cm$^2$. With the programmable table moving at a speed of approximately 3 mm/sec, and laser power readings of 20 and 30 watts, conductive carbon paths with linear resistances of approximately 9.4 and 4.1 ohms/cm, respectively, were produced. Similarly, with a table speed of approximately 5 mm/sec and laser power readings of 20 and 30 watts, conductive carbon paths with linear resistances of approximately 11 and 6.3 ohms/cm, respectively, were produced.

EXAMPLE 3

An experiment was carried out, analogous to Example 1, using a Nd:YAG laser (manufactured by Instamark Inc.) with an emission wavelength of 1.06 micrometers to irradiate a sample of polyfurfuryl alcohol (made by mixing Quacorr Resin 1001 with 3 percent Quacorr Catalyst 2001, curing the mixture for 1 hour at a temperature of 60 degrees C., 2 hours at 90 degrees C., and 1 hour at 120 degrees C.). The laser was operated with a 84 mm focal-length lens. With the x-y-programmable table moving at a rate of 11 mm/sec, and with laser power readings of 12 watts and 19 watts, conductive carbon paths with linear resistances of 12 and 10 ohms/cm, respectively, were produced.

EXAMPLE 4

An electrically conductive pattern made as described in Example 1 was plated with nickel phosphide by electroplating from a bath comprising 50 grams per liter H$_3$PO$_4$ and 5 grams per liter H$_3$PO$_3$ dissolved in 0.8-molar nickel chloride. Current density was approximately 150 mA/cm$^2$, and plating continued for approximately 1 minute. The plated paths had the silvery appearance of nickel phosphide.

What is claimed is:

1. A method for making a conductive pattern on a substrate of which at least a surface portion consists essentially of a polymeric material, said method comprising a step of directing a laser beam onto said surface portion and causing relative motion between said beam and said substrate so as to delineate said pattern on said surface portion, said motion being controlled so as to cause thermal decomposition of selected portions of said material, whereby said selected portions are transformed into an electrically conductive carbon material such that rsistance of conductive paths in said pattern is less than 16 ohms/cm.

2. Method of claim 1 in which said laser beam traverses an optical lens.

3. Method of claim 2 in which said laser beam is defocused by said lens.

4. Method of claim 1 in which said laser beam is produced by a CO$_2$ laser or a Nd:YAG laser.

5. Method of claim 1 in which said laser beam is deflected by a movable mirror.

6. Method of claim 1 in which said substrate is a circuit board.

7. Method of claim 1 in which said substrate is an interconnection block.

8. Method of claim 1 in which said substrate is a module/daughter board.

9. Method of claim 1, said method comprising a step of plating metal onto said selected portions.

10. Article of manufacture having a conductive pattern made by the method of claim 1.

* * * * *